US011901695B2

(12) United States Patent
Miyata (10) Patent No.: US 11,901,695 B2
(45) Date of Patent: Feb. 13, 2024

(54) LIGHT EMITTING DEVICE AND PROJECTOR

(71) Applicant: Seiko Epson Corporation, Toyko (JP)

(72) Inventor: Takashi Miyata, Shiojiri (JP)

(73) Assignee: SEIKO EPSON CORPORATION

( * ) Notice: Subject to any disclaimer, the term of this patent is extended or adjusted under 35 U.S.C. 154(b) by 433 days.

(21) Appl. No.: 17/130,309

(22) Filed: Dec. 22, 2020

(65) Prior Publication Data

US 2021/0194209 A1 Jun. 24, 2021

(30) Foreign Application Priority Data

Dec. 23, 2019 (JP) .................................. 2019-231182

(51) Int. Cl.
*H01S 5/042* (2006.01)
*H01S 5/20* (2006.01)
(Continued)

(52) U.S. Cl.
CPC ...... *H01S 5/04252* (2019.08); *G03B 21/2033* (2013.01); *H01S 5/04253* (2019.08);
(Continued)

(58) Field of Classification Search
CPC ........................ H01S 5/11; H01S 5/185; H01S 5/0425–0428; H01S 5/341; H01S 5/1042;
(Continued)

(56) References Cited

U.S. PATENT DOCUMENTS

| 5,104,824 A | * | 4/1992 | Clausen, Jr. | ............ | H01S 5/423 |
| | | | | | 257/E21.123 |
| 6,727,646 B1 | * | 4/2004 | Koyama | ................ | H10K 50/85 |
| | | | | | 428/917 |

(Continued)

FOREIGN PATENT DOCUMENTS

| FR | 2992473 A1 | * | 12/2013 | ........... | H01L 21/187 |
| JP | 2004193527 A | * | 7/2004 | ............ | B82Y 20/00 |

(Continued)

OTHER PUBLICATIONS

Ra et al., "Understanding the p-Type GaN Nanocrystals on InGaN Nanowire Heterostructures", Sep. 17, 2019, ACS Photonics, 6, 2397-2404. (Year: 2019).*

(Continued)

*Primary Examiner* — Joshua King
(74) *Attorney, Agent, or Firm* — Harness, Dickey & Pierce, P.L.C.

(57) ABSTRACT

A light emitting device includes: a substrate; a laminated structure that is provided on the substrate and that includes a plurality of columnar portions; and an electrode provided at an opposite side of the laminated structure from the substrate. The columnar portion includes a first semiconductor layer, a second semiconductor layer of a conductivity type different from that of the first semiconductor layer, and a light emitting layer located between the first semiconductor layer and the second semiconductor layer. The electrode is connected to the second semiconductor layers in the plurality of columnar portions, and includes a first electrode (Continued)

layer formed of a material that has a work function smaller than that of the second semiconductor layer, and a second electrode layer that is connected to the first electrode layer and that has a work function smaller than that of the first electrode layer. An interface between the first electrode layer and the second electrode layer has an uneven shape.

6 Claims, 6 Drawing Sheets

(51) Int. Cl.
| | | |
|---|---|---|
| H01S 5/11 | (2021.01) | |
| H01S 5/34 | (2006.01) | |
| H01S 5/02 | (2006.01) | |
| H01S 5/40 | (2006.01) | |
| H01S 5/185 | (2021.01) | |
| H01S 5/42 | (2006.01) | |
| G03B 21/20 | (2006.01) | |
| B82Y 20/00 | (2011.01) | |

(52) U.S. Cl.
CPC ............ *H01S 5/04254* (2019.08); *H01S 5/11* (2021.01); *H01S 5/2054* (2013.01); *H01S 5/341* (2013.01); *B82Y 20/00* (2013.01); *H01S 5/021* (2013.01); *H01S 5/04257* (2019.08); *H01S 5/185* (2021.01); *H01S 5/4012* (2013.01); *H01S 5/4093* (2013.01); *H01S 5/42* (2013.01); *H01S 2301/176* (2013.01)

(58) Field of Classification Search
CPC ......... H01S 5/183; B28Y 20/00; H01L 33/08; H01L 33/38; H01L 33/40; H01L 33/42
See application file for complete search history.

(56) References Cited

U.S. PATENT DOCUMENTS

| | | | | |
|---|---|---|---|---|
| 7,435,996 B2* | 10/2008 | Jin | .......................... | B82Y 20/00 257/E51.026 |
| 7,826,512 B2* | 11/2010 | Ueda | ....................... | B82Y 20/00 372/87 |
| 8,183,576 B2* | 5/2012 | Min | ......................... | H01L 33/18 977/932 |
| 2004/0157354 A1* | 8/2004 | Kuriyama | ............. | H01L 31/105 438/45 |
| 2004/0253758 A1 | 12/2004 | Jung et al. | | |
| 2005/0069012 A1* | 3/2005 | Shimomura | ........ | H01S 5/04253 372/87 |
| 2005/0167681 A1* | 8/2005 | Kwak | ...................... | H01L 33/42 257/E29.144 |
| 2005/0194598 A1* | 9/2005 | Kim | ........................ | H01L 33/08 257/79 |
| 2005/0224783 A1* | 10/2005 | Matsuyama | .......... | H01S 5/2231 257/14 |
| 2006/0002442 A1 | 1/2006 | Haberern et al. | | |
| 2006/0043388 A1* | 3/2006 | Kwak | ................... | H01L 33/405 257/E33.068 |
| 2006/0126695 A1* | 6/2006 | Koyama | ............... | H01S 5/0264 372/50.124 |
| 2006/0208273 A1* | 9/2006 | Kang | ....................... | H01L 33/08 257/103 |
| 2007/0248132 A1* | 10/2007 | Kikuchi | ................ | H01L 33/007 438/150 |
| 2008/0029777 A1* | 2/2008 | Shiga | ..................... | B82Y 20/00 257/E33.001 |
| 2008/0128716 A1* | 6/2008 | Tazima | ................... | H01L 33/20 257/88 |
| 2008/0210956 A1* | 9/2008 | Kim | ........................ | H01L 33/08 257/E33.001 |
| 2009/0101928 A1 | 4/2009 | Kim et al. | | |
| 2011/0142089 A1* | 6/2011 | Kudo | ........................ | H01S 5/22 372/46.012 |
| 2011/0254034 A1* | 10/2011 | Konsek | ................... | H01L 33/08 257/E33.072 |
| 2011/0309382 A1* | 12/2011 | Lowgren | ................ | H01L 33/08 257/E33.072 |
| 2012/0012884 A1* | 1/2012 | Muramoto | ............. | H01L 33/06 257/E33.062 |
| 2012/0205613 A1* | 8/2012 | Mi | ........................ | H01L 29/775 257/E21.09 |
| 2012/0213242 A1* | 8/2012 | Tanaka | ................ | H01S 5/04253 372/50.1 |
| 2013/0016751 A1* | 1/2013 | Takado | ............... | H01S 5/34333 372/45.01 |
| 2014/0034981 A1* | 2/2014 | Hung | ..................... | H01L 33/46 257/98 |
| 2015/0280062 A1* | 10/2015 | Yoo | ......................... | H01L 33/52 257/13 |
| 2015/0346522 A1 | 12/2015 | Hilarius et al. | | |
| 2016/0027961 A1* | 1/2016 | Mi | ......................... | H01L 33/06 257/13 |
| 2019/0267775 A1* | 8/2019 | Noda | .................... | H01S 5/0425 |
| 2020/0373731 A1 | 11/2020 | Noda | | |
| 2021/0119420 A1* | 4/2021 | Ra | ........................... | H01S 5/183 |
| 2021/0202450 A1* | 7/2021 | Min | ..................... | H01L 27/1214 |
| 2022/0311205 A1 | 9/2022 | Noda | | |

FOREIGN PATENT DOCUMENTS

| | | | | | |
|---|---|---|---|---|---|
| JP | 2005-005266 A | | 1/2005 | | |
| JP | 2008-517477 A | | 5/2008 | | |
| JP | 2009076896 A | * | 4/2009 | | |
| JP | 2009105182 A | * | 5/2009 | | |
| JP | 2009140976 A | * | 6/2009 | | |
| JP | 2009-152474 A | | 7/2009 | | |
| JP | 2010-287761 A | | 12/2010 | | |
| JP | 4803302 B2 | | 10/2011 | | |
| JP | 5009841 B2 | | 8/2012 | | |
| JP | 2015-522837 A | | 8/2015 | | |
| JP | 2019-029513 A | | 2/2019 | | |
| KR | 20140125521 A | * | 10/2014 | | |
| WO | WO-2018222332 A1 | * | 12/2018 | ........... | H01L 27/124 |
| WO | WO-2019039238 A1 | * | 2/2019 | ........... | C23C 14/06 |
| WO | WO-2019199117 A1 | * | 10/2019 | ........... | H01S 5/0425 |
| WO | WO-2020050468 A1 | * | 3/2020 | ............ | G06F 3/147 |

OTHER PUBLICATIONS

Higurashi et al., "Low-Temperature Bonding of Laser Diode Chips on Silicon Substrates Using Plasma Activation of Au Films", Dec. 15, 2007, IEEE Photonics Letters, vol. 19, No. 24, 1994-1996. (Year: 2007).*

Cheng et al., "GaN-based LEDs Surrounded with a Two-Dimensional Nanohole Photonic Crystal Structure for Effective Laterally Guided Mode Coupling", May 1, 2011, Optics Letters, vol. 36, No. 9, 1611-1613. (Year: 2011).*

Horng et al., "GaN-based Light-Emitting Diodes with Indium Tin Oxide Texturing Window Layers Using Natural Lithography", 2005 Applied Physics Letters, 86, 22110, 1-3. (Year: 2005).*

* cited by examiner

LIGHT EMITTING DEVICE AND PROJECTOR

The present application is based on, and claims priority from JP Application Serial Number 2019-231182, filed Dec. 23, 2019, the disclosure of which is hereby incorporated by reference herein in its entirety.

BACKGROUND

1. Technical Field

The present disclosure relates to a light emitting device and a projector including the light emitting device.

2. Related Art

A semiconductor laser is expected as a next-generation light source which has high luminance. In particular, a semiconductor laser which has a nanostructure called a nanocolumn, a nanowire, a nanorod, a nanopillar, or the like is expected to implement a light emitting device capable of emitting light with high output at a narrow emission angle due to an effect of a photonic crystal.

JP-A-2009-152474 discloses a semiconductor light emitting device having a plurality of nanocolumns. In JP-A-2009-152474 (FIG. 3), a transparent electrode is formed by using a vapor deposition method on the nanocolumns forested at a constant pitch. An insulating film is formed on a side surface of a columnar nanocolumn, and a p-type GaN layer is exposed on a planar top portion, and the transparent electrode is formed so as to cover the top portion. Since the transparent electrode is formed so as to cover the forested nanocolumns, the transparent electrode recesses at gap portions between adjacent nanocolumns, and a surface of the transparent electrode is wavy.

However, in the technique of JP-A-2009-152474, it is difficult to establish stable electrical connection between the transparent electrode and the plurality of nanocolumns. Since a top portion of an actual nanocolumn has a dome shape with a curved surface or a cone shape with a gentle taper, adhension of the transparent electrode formed of an oxide film is not good as compared with the case where the top portion is planar. In addition, when the transparent electrode is formed of indium tin oxide (ITO), it may be difficult for a current to flow between the transparent electrode and the p-type GaN layer. Specifically, since the p-type GaN layer with a work function of about 6.7 eV and the ITO with a work function of about 4.3 eV have large energy barrier at an interface therebetween, it is difficult for the current to flow due to hole transport.

SUMMARY

An object of the present disclosure is to provide a light emitting device that secures stable electrical connection and a highly reliable projector.

A light emitting device according to the present application includes: a substrate; a laminated structure that is provided on the substrate and that includes a plurality of columnar portions; and an electrode provided at an opposite side of the laminated structure from the substrate. The columnar portion includes a first semiconductor layer, a second semiconductor layer of a conductivity type different from that of the first semiconductor layer, and a light emitting layer located between the first semiconductor layer and the second semiconductor layer. The electrode is connected to the second semiconductor layers in the plurality of columnar portions, and includes a first electrode layer formed of a material that has a work function smaller than that of the second semiconductor layer, and a second electrode layer that is connected to the first electrode layer and that has a work function smaller than that of the first electrode layer. An interface between the first electrode layer and the second electrode layer has an uneven shape.

DESCRIPTION OF EXEMPLARY EMBODIMENTS

First Embodiment

Outline of Light Emitting Device

Figure 1:
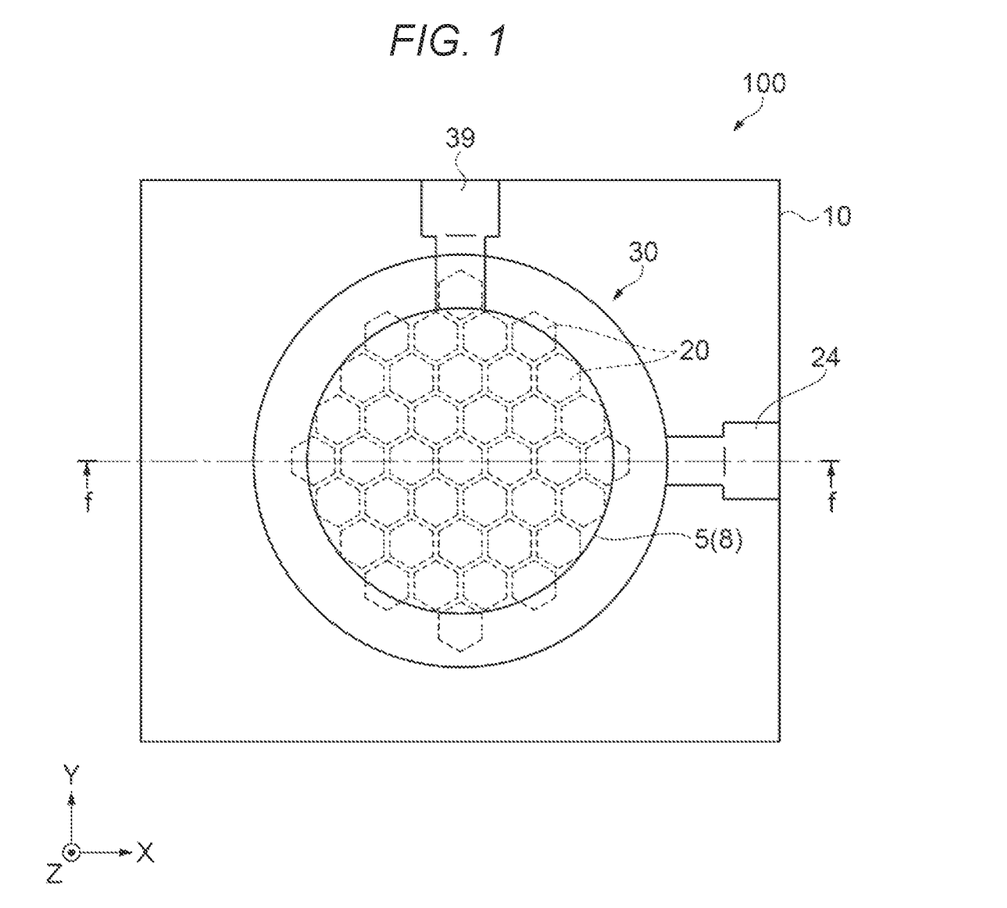
FIG. 1 is a plan view of a light emitting device according to a first embodiment.
Figure 2:
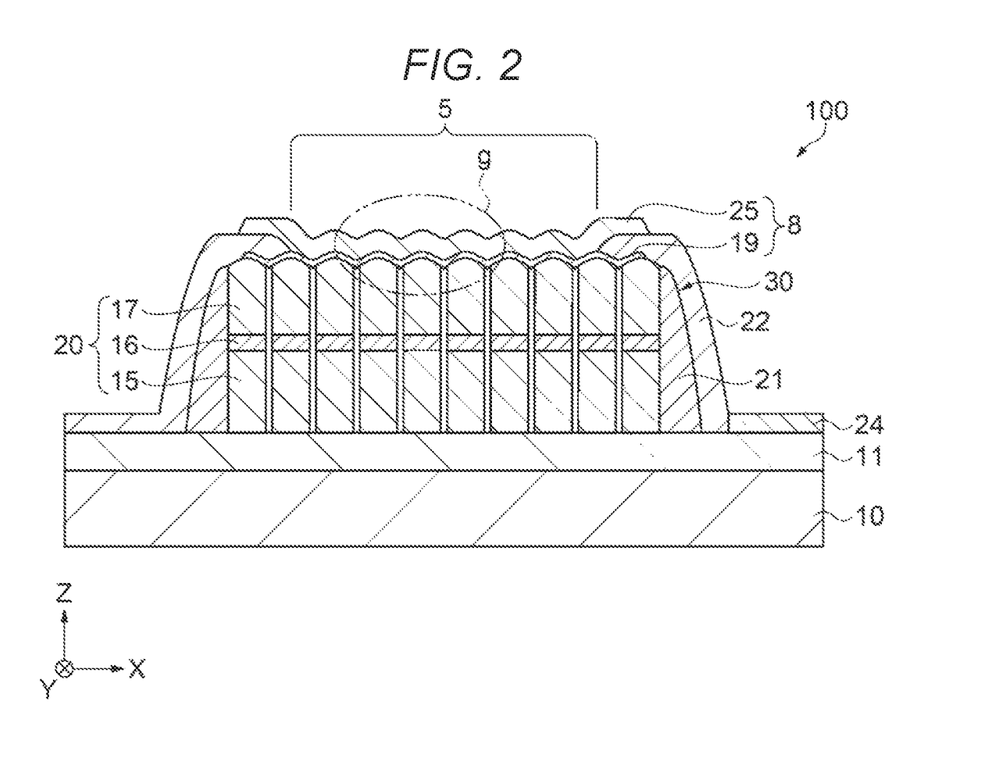
FIG. 2 is a cross-sectional view of the light emitting device.

FIG. 1 is a plan view of a light emitting device according to the present embodiment. FIG. 2 is a cross-sectional view of the light emitting device taken along a line f-f of FIG. 1. First, an outline of a light emitting device 100 according to the present embodiment will be described with reference to FIGS. 1 and 2. The light emitting device 100 is a semiconductor laser light source including a plurality of nanocolumns that are fine columnar crystal structures that combine electrons and holes in a semiconductor to emit light. When the light emitting device 100 is actually used as a light source, an assembly in which a plurality of light emitting devices 100 are regularly arranged is often used as a surface light source.

In FIG. 1, description is made with a light emitting region 5 as a center, a direction of an n-electrode terminal 24 as a +X direction and a direction of a p-electrode terminal 39 as a +Y direction. The +X direction is also referred to as a right direction and a −X direction is also referred to as a left direction. In FIG. 2, a stacking direction on a substrate 10 is defined as a +Z direction. The +Z direction is also referred to as an upper direction.

As shown in FIG. 2, the light emitting device 100 includes a laminated structure 30 including a plurality of columnar portions 20 on the substrate 10.

The substrate 10 is a substrate, and a Si substrate is used as a preferred example. The substrate is not limited to the Si substrate, and a GaN substrate, a sapphire substrate, a glass substrate, or the like may be used.

A buffer layer 11 is formed at a surface of the substrate 10. The buffer layer 11 is an n-type GaN layer doped with Si as a preferred example. Since the buffer layer 11 is a part of the substrate 10, the substrate 10 may be regarded as including the buffer layer 11.

A reflective layer may be provided between the substrate 10 and the buffer layer 11 or on a bottom surface of the substrate 10. The reflective layer is a distributed bragg reflector (DBR) layer. Since light toward the substrate 10 among light emitted from a light emitting layer 16 can be reflected by the reflective layer, light utilization efficiency can be improved.

The columnar portion 20 is a nanocolumn formed on the buffer layer 11, and includes a first semiconductor layer 15, the light emitting layer 16, and a second semiconductor layer 17. Specifically, the columnar portion 20 is a columnar structure in which the first semiconductor layer 15, the light emitting layer 16, and the second semiconductor layer 17 are stacked in this order on the buffer layer 11. In a preferred example, a height of the columnar portion 20 is about 1000 nm. The columnar portion 20 is also referred to as a nanowire, a nanorod, or a nanopillar.

The first semiconductor layer 15 is an n-type semiconductor layer. In a preferred example, the first semiconductor layer 15 is an n-type GaN layer which is doped with Si.

In a preferred example, the light emitting layer 16 has a multiple quantum well structure in which quantum well structures including an i-type GaN layer which is not doped with impurities and an i-type InGaN layer are stacked. The light emitting layer 16 emits light when a current is injected from a p-side electrode 8 to be described later.

The second semiconductor layer 17 is a p-type semiconductor layer of a different conductivity type from the first semiconductor layer 15. In a preferred example, the second semiconductor layer 17 is a p-type GaN layer which is doped with Mg. The first semiconductor layer 15 and the second semiconductor layer 17 also function as a cladding layer that confines light to the light emitting layer 16. An upper portion (end surface) of the columnar portion 20 formed of the second semiconductor layer 17 has a dome shape with a rounded top portion. The shape of the top portion may be an obtuse cone shape depending on a growth condition.

The columnar portion 20 is not limited to a configuration in which the first semiconductor layer 15, the light emitting layer 16, and the second semiconductor layer 17 are stacked in this order from the substrate 10 side, and a stacking order thereof may be reversed. For example, the columnar portion 20 may have a configuration in which the second semiconductor layer 17, the light emitting layer 16, and the first semiconductor layer 15 are stacked in this order on the substrate 10. In this case, the current is injected from the substrate 10 side.

As shown in FIG. 1, the light emitting device 100 includes the light emitting region 5 in which light from the plurality of columnar portions 20 is emitted. The light emitting region 5 has a substantially circular shape in a plan view, and the plurality of columnar portions 20 are regularly arranged in the circular shape.

Each of the columnar portions 20 has a substantially regular hexagonal shape in a plan view. A diameter of a circle circumscribed to the hexagonal shape is about 280 nm in the preferred example. The diameter is not limited to thereto, and may be 10 nm or more and 500 nm or less. In the present embodiment, the diameter of the circumscribed circle is regarded as a diameter of the columnar portions 20. A planar shape of the columnar portions 20 is not limited to the hexagonal shape, and may be another polygonal shape or a circle.

The plurality of columnar portions 20 are arranged in a hexagonal pattern at a constant pitch. An arrangement pitch of the adjacent columnar portions 20 is about 300 nm in the preferred example. The arrangement pitch is not limited to thereto, and may be 1 nm or more and 500 nm or less. A gap between the adjacent columnar portions 20 is from about 10 to 20 nm. The gap serves as an air layer.

In addition, an arrangement form is not limited to the hexagonal pattern, and may be regular. For example, a lattice shape, a triangular lattice shape, a square lattice shape may be used.

FIG. 2 will be described again.

A sidewall 21 is provided around a columnar portion group formed by the forested columnar portions 20. The sidewall 21 is a silicon oxide layer in a preferred example. A material of the sidewall 21 is not limited thereto, and is preferably a material which has a refractive index lower than that of the light emitting layer 16. For example, the sidewall 21 may be an aluminum oxide layer or a titanium oxide layer. In the present embodiment, a configuration portion including the plurality of columnar portions 20 and the sidewall 21 that covers the sidewall of the columnar portions 20 is used as the laminated structure 30.

A first electrode layer 19 is provided to cover top portions of the plurality of columnar portions 20. The first electrode layer 19 is a metal layer, and has a two-layer structure of a metal thin film. Details will be described later.

An insulating layer 22 is provided around the laminated structure 30. The insulating layer 22 is an insulating protective layer that opens the light emitting region 5 at the top portion of the laminated structure 30 and covers the periphery of the laminated structure 30. In the preferred example, the insulating layer 22 is formed of silicon oxide. Any material may be used as long as the material is an insulating material. For example, silicon nitride or polyimide may be used.

A second electrode layer 25 is provided to cover the first electrode layer 19 and a part of the insulating layer 22. The second electrode layer 25 is a transparent electrode layer, and indium tin oxide (ITO) is used as the preferred example. The p-side electrode 8 as an electrode is formed of the first electrode layer 19 and the second electrode layer 25. Details of the p-side electrode 8 will be described later.

The n-electrode terminal 24 is provided in the +X direction of the laminated structure 30. The n-electrode terminal 24 is electrically connected to the first semiconductor layers 15 of the plurality of columnar portions 20 by a wiring (not shown). The n-electrode terminal 24 is formed of a metal wiring formed on the buffer layer 11.

FIG. 1 will be described again.

The p-electrode terminal 39 is provided in the +Y direction of the laminated structure 30. The p-electrode terminal 39 is electrically connected to the second electrode layer 25 of the p-side electrode 8. In other words, the p-electrode terminal 39 is electrically connected to the second semiconductor layers 17 of the plurality of columnar portions 20.

The n-electrode terminal 24 and the p-electrode terminal 39 are power input terminals. For example, a bonding wire is connected to the power input terminals and a drive signal for driving light emission is input.

Detailed Configuration of P-Side Electrode

Figure 3:
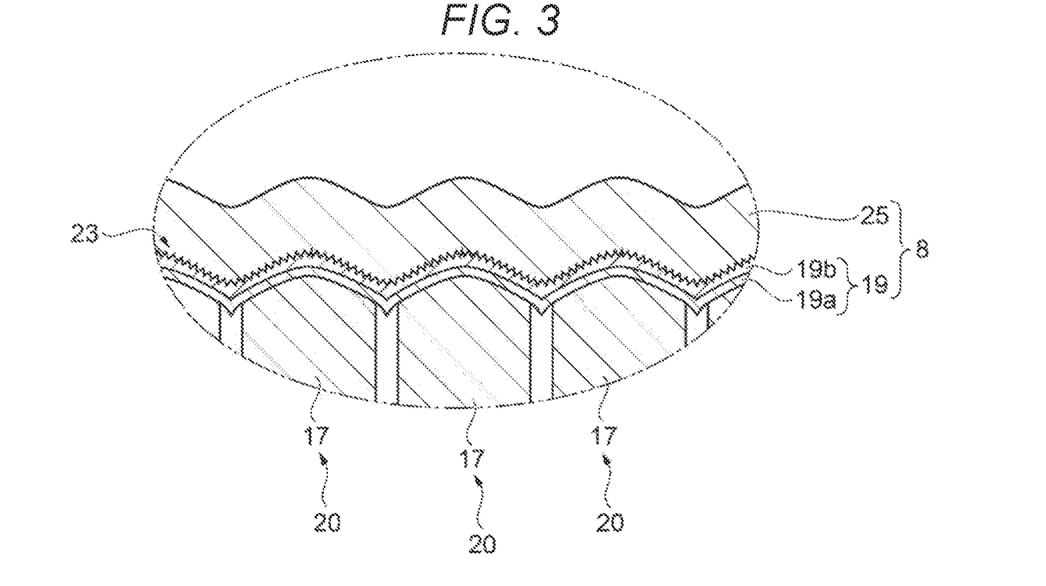
FIG. 3 is an enlarged view of a g-portion in FIG. 2.

FIG. 3 is an enlarged view of a g-portion in FIG. 2, and is an enlarged cross-sectional view around the p-side electrode 8.

As described above, the top portion of the columnar portion 20 has a rounded dome shape. Further, since there is a gap between the adjacent columnar portions 20, a surface (upper surface) connecting the top portions of the plurality of columnar portions 20 has a wavy shape as shown in FIG. 3.

Since the p-side electrode 8 is provided so as to cover the top portions of the plurality of columnar portions 20, the p-side electrode 8 is formed following the wavy shape.

The p-side electrode 8 has a two-layer structure including the first electrode layer 19 and the second electrode layer 25.

The first electrode layer 19 has a two-layer structure including a first metal layer 19a and a second metal layer 19b. In a preferred example, Ni is used for the first metal layer 19a and Au is used for the second metal layer 19b. A thickness of the first metal layer 19a formed of the Ni layer is about 10 nm, and a thickness of the second metal layer 19b formed of the Au layer is about 10 nm, which form a thin film which has a total thickness of about 20 nm. Translucency is secured by making the film thin as described above. The thickness is not limited thereto, and any thickness can be used as long as the required translucency can be secured.

Further, since the metal thin film is flexible, the metal thin film also fits the shape of the wavy upper surface formed by the plurality of columnar portions 20. Since the columnar portion 20 is a crystal, the surface thereof is smooth, but the metal thin film can be formed on the surface with good adhesion.

The second electrode layer 25 formed of a transparent electrode layer is provided on the second metal layer 19b in the first electrode layer 19. In the preferred example, ITO is used as the second electrode layer 25, and a film thickness is increased to about 200 nm in order to reduce electric resistance.

Here, an uneven shape 23 is provided at an interface between the second metal layer 19b of the first electrode layer 19 and the second electrode layer 25. Specifically, the uneven shape 23 is formed on a surface of the second metal layer 19b formed of the Au layer, and the second electrode layer 25 provided on the second metal layer 19b also has a shape following the uneven shape 23. The uneven shape 23 has a fine uneven shape of 10 nm or less, and is formed on the entire surface of the second metal layer 19b. A method of forming the uneven shape 23 will be described later.

Figure 4:
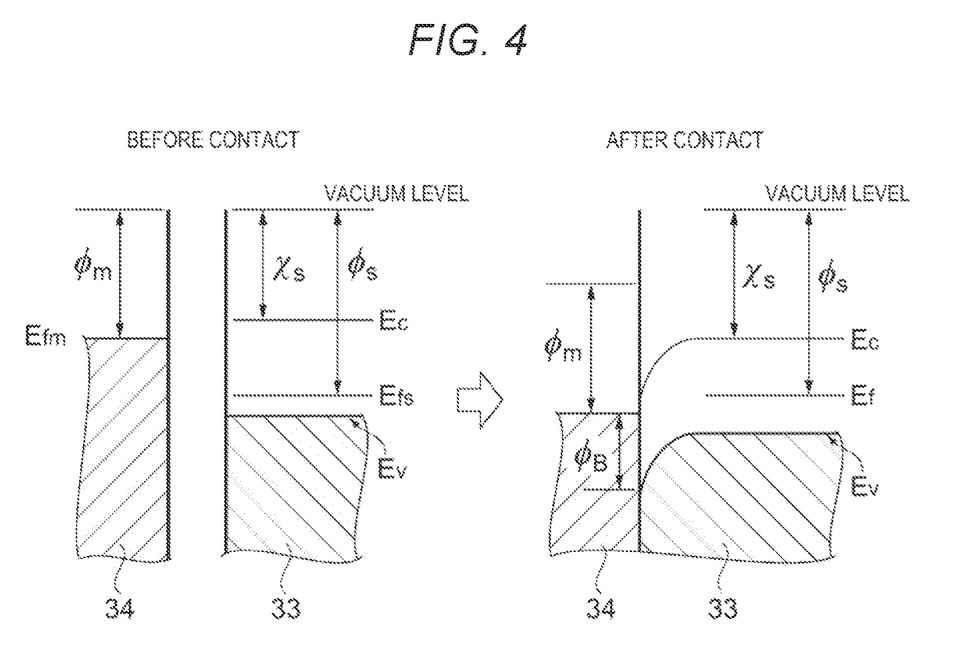
FIG. 4 is a band diagram before and after contact between a metal and a semiconductor.

FIG. 4 is a band diagram before and after contact between a metal and a semiconductor.

A left side of FIG. 4 is a band diagram of a metal 34 and a semiconductor 33 before contact, and a right side is a band diagram after contact. In FIG. 4, a Fermi level of the metal 34 is $E_{fm}$, a Fermi level of the semiconductor 33 is $E_{fs}$, and an electron affinity of the semiconductor is $X_s$.

When a metal electrode is connected to the semiconductor, an ohmic contact is ideally formed if a work function $\Phi_m$ of the metal 34>the work function $\Phi_s$ of the semiconductor 33. However, it is difficult to satisfy such a relationship in the configuration of the present embodiment. Specifically, a relationship in which the work function $\Phi_s$ of the second semiconductor layer 17 formed of the p-type GaN layer of the columnar portion 20 is as large as about 6.7 ev, while the work function $\Phi_s$ of the second electrode layer 25 formed of ITO is as small as about 4.3 ev is obtained. Therefore, as shown in the right side diagram of FIG. 4, after the contact between the metal and the semiconductor, an energy barrier $\Phi B$ is generated, and it is difficult for the current to flow due to the contact resistance.

In view of this point, a configuration in which the energy barrier is gradually relaxed is adopted. Specifically, in order to gradually reduce the energy barrier $\Phi B$, the first electrode layer 19 which has the two-layer structure is interposed between the second semiconductor layer 17 and the second electrode layer 25.

First, the second semiconductor layer 17 which has the work function $\Phi_s$ of about 6.7 ev is brought into contact with the first metal layer 19a formed of the Ni layer which has the work function $\Phi m$ of about 5.2 ev. Then, the second metal layer 19b formed of the Au layer which has the work function $\Phi m$ of about 4.7 eV is provided on the first metal layer 19a. Then, the second electrode layer 25 formed of ITO which has the work function $\Phi m$ of about 4.3 eV is provided on the second metal layer 19b. That is, by adopting a configuration in which the work function has a relationship that a work function of the second semiconductor layer 17>a work function of the first metal layer 19a>a work function of the second metal layer 19b>a work function of the second electrode layer 25, the energy barrier $\Phi B$ is gradually reduced to facilitate flowing of the current.

If the relationship is satisfied, the material of the metal layer or the transparent electrode may be changed. For example, indium zinc oxide (IZO) which has the work function $\Phi m$ of about 4.6 eV may be used instead of the ITO of the second electrode layer 25.

FIG. 2 will be described again.

In the light emitting device 100 having such a configuration, the p-type second semiconductor layer 17, the light emitting layer 16, and the n-type first semiconductor layer 15 of the columnar portion 20 form a pin diode. When a forward bias voltage of the pin diode is applied between the p-electrode terminal 39 (FIG. 1) and the n-electrode terminal 24, a current is injected into the light emitting layer 16 to recombine electrons and holes in the light emitting layer 16. The recombination causes light emission.

The light generated in the light emitting layer 16 propagates through the air layer of the gap in a direction orthogonal to the stacking direction of the first semiconductor layer 15 and the second semiconductor layer 17, forms a standing wave by an effect of a photonic crystal based on the plurality of columnar portions 20, and laser oscillates by receiving gain in the light emitting layer 16. Then, the light emitting device 100 emits positive first-order diffracted light and negative first-order diffracted light as laser light from the light emitting region 5.

Manufacturing Method of Light Emitting Device

Figure 5:
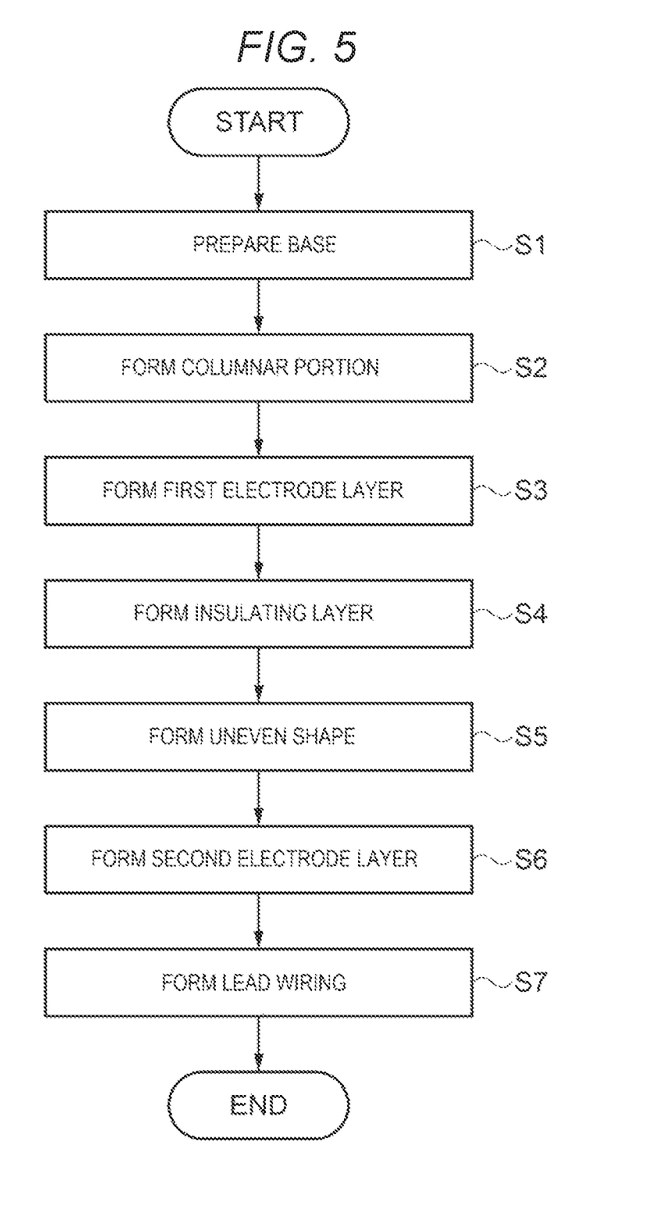
FIG. 5 is a flowchart showing a manufacturing method of the light emitting device.
Figure 6A:
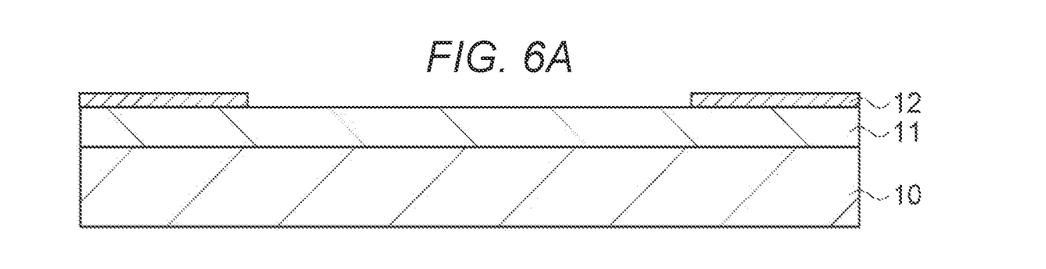
FIG. 6A is a process diagram showing a product form in a manufacturing process.
Figure 6B:
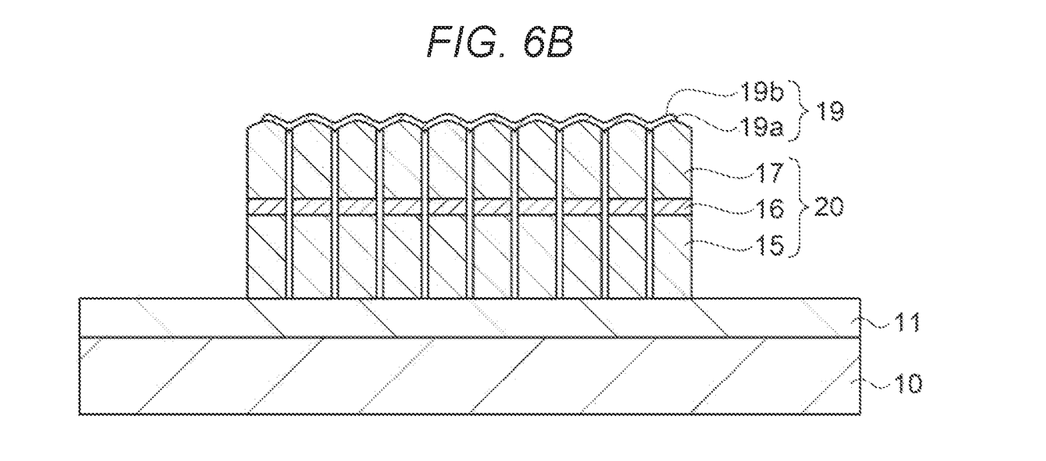
FIG. 6B is a process diagram showing a product form in the manufacturing process.
Figure 6C:
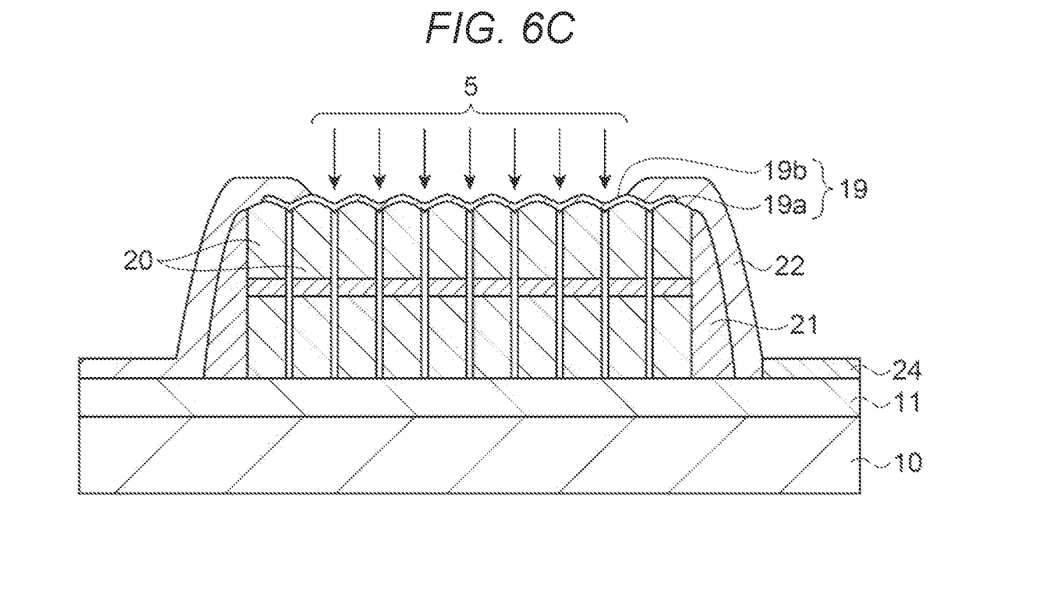
FIG. 6C is a process diagram showing a product form in the manufacturing process.

FIG. 5 is a flowchart showing a manufacturing method of the light emitting device. FIGS. 6A to 6C are process diagrams showing a product form in the manufacturing process. Here, a manufacturing method of the light emitting device will be described mainly with reference to FIG. 5 and with reference to FIGS. 2 and 6A to 6C as appropriate.

The light emitting device 100 can be basically manufactured by a method used in known semiconductor processes such as a chemical vapor deposition (CVD) method, a photolithography method (patterning), a sputtering method, a vapor deposition method (vacuum vapor deposition method), an etching method, a chemical mechanical planarization (CMP) method, or a combination thereof. Although a suitable manufacturing method will be mainly described, another manufacturing method may be used as long as an equivalent structure can be formed and the function and characteristics of the structure can be satisfied.

In step S1, the substrate 10 is prepared prior to formation of the nanocolumns. Specifically, as shown in FIG. 6A, the buffer layer 11 is epitaxially grown on the substrate 10. As a method of epitaxial growth, a metal organic chemical vapor deposition (MOCVD) method, a molecular beam epitaxy (MBE) method, or the like is used. Next, a selection mask 12, which is a hard mask for partitioning a formation region of the columnar portions 20, is formed on the buffer layer 11. Ti is used as the selection mask 12 in a preferred example. In FIG. 6A, the entire formation region of the plurality of columnar portions 20 is used as an opening of the selection mask 12. However, in reality, an opening corresponding to each columnar portion 20 is formed. The selection mask 12 is formed by, for example, forming a film by the sputtering method and then performing patterning.

In step S2, the plurality of columnar portions 20 are formed. Specifically, the first semiconductor layer 15, the light emitting layer 16, and the second semiconductor layer 17 are epitaxially grown in this order on the buffer layer 11 in the opening of the selection mask 12. As a method of the epitaxial growth, the MOCVD method, the MBE method, or the like is used. Accordingly, as shown in FIG. 6B, the plurality of columnar portions 20 can be formed. The thickness of the columnar portion 20 and the shape of the top portion can be changed by adjusting growth conditions.

In step S3, the first electrode layer 19 is formed on the upper surfaces of the plurality of columnar portions 20. First, a resist mask which has an opening in a region for the first electrode layer 19 is formed, and a Ni layer serving as the first metal layer 19a is film-formed on the entire surface by the vapor deposition method. Next, an Au layer serving as the second metal layer 19b is film-formed on the entire surface by the vapor deposition method, which overlaps the Ni layer. Next, the resist mask is removed. That is, as shown in FIG. 6B, the first electrode layer 19 is formed on the upper surfaces of the plurality of columnar portions 20 by lift-off.

In step S4, the sidewall 21 and the insulating layer 22 are formed.

First, the sidewall 21 is formed. The silicon oxide layer is film-formed on the entire surface including the plurality of columnar portions 20. In the preferred example, an Atomic layer deposition (ALD) method is used for the film formation. Next, a resist mask which has an opening in the region of the first electrode layer 19 is formed, and patterning including dry etching is performed. Accordingly, as shown in FIG. 6C, the sidewall 21 is formed on side surfaces of the plurality of columnar portions 20.

Next, the insulating layer 22 is formed. Specifically, after the silicon oxide layer is film-formed on the entire surface, the patterning including the dry etching is performed to form the insulating layer 22 in a state in which the light emitting region 5 is opened, as shown in FIG. 6C.

In step S5, the uneven shape 23 is formed on the surface of the second metal layer 19b. Specifically, by performing plasma processing of a dry process using a mixed gas in which oxygen is mixed with argon gas, the uneven shape 23 is formed on the surface of the Au layer. Accordingly, the fine uneven shape 23 of 10 nm or less is formed on the surface of the Au layer. The uneven shape 23 is also formed in valleys of the wavy upper surface formed by the plurality of columnar portions 20 in the same manner as the top portions. The method is not limited thereto, and a method capable of forming a similar uneven shape may be used.

In step S6, the second electrode layer 25 is formed on the upper surface of the first electrode layer 19. Specifically, after the ITO layer is film-formed on the entire surface by the sputtering method, the patterning including the dry etching is performed to form the second electrode layer 25 that covers the first electrode layer 19 and a part of and the insulating layer 22, as shown in FIG. 2. Accordingly, the p-side electrode 8 is formed. The vapor deposition method may be used for the film formation.

In step S7, a lead wiring and the p-electrode terminal 39 are formed. The p-electrode terminal 39 and the lead wiring that couples the p-side electrode 8 and the p-electrode terminal 39 are formed by forming the metal layer film by the vapor deposition method and then performing the patterning including the dry etching. In the same step, the n-electrode terminal 24 is also formed. Accordingly, the light emitting device 100 shown in FIGS. 1 and 2 is formed.

According to the present embodiment, the following effects can be obtained.

The p-side electrode 8 includes the first electrode layer 19 formed of a material which has the work function smaller than that of the second semiconductor layer 17 and connected to the second semiconductor layer 17 in the plurality of columnar portions 20, and the second electrode layer 25 which has the work function smaller than that of the first electrode layer 19 and connected to the first electrode layer 19. The interface between the first electrode layer 19 and the second electrode layer 25 has the uneven shape 23.

According to the configuration, since the work function of the first electrode layer 19 is smaller than that of the second electrode layer 25, the energy barrier between the first electrode layer 19 and the second semiconductor layer 17 formed of the p-type GaN layer is smaller than a case where the second semiconductor layer 17 and the second electrode layer 25 are indirect contact with each other. In other words, by interposing the first electrode layer 19, the energy barrier between the second semiconductor layer 17 and the second electrode layer 25 is gradually reduced and relaxed, so that the current easily flows.

Furthermore, since a contact area between the first electrode layer 19 and the second electrode layer 25 is increased due to the uneven shape 23, the contact resistance is reduced and, the adhesion between the first electrode layer 19 and the second electrode layer 25 is improved.

Therefore, it is possible to provide the light emitting device 100 that secures stable electrical connection The first electrode layer 19 is a metal layer, and includes the first metal layer 19a and the second metal layer 19b. The work function of the first metal layer 19a connected to the second semiconductor layer 17 is larger than the work function of the second metal layer 19b.

According to the configuration, since the first electrode layer 19 formed of a metal layer which has excellent adhesion is provided between the second semiconductor layer 17 and the second electrode layer 25, the adhesion to the second semiconductor layer 17 of the columnar portions 20 is improved. Further, since the configuration in which the work function has a relationship that the work function of the second semiconductor layer 17>the work function of the first metal layer 19a>the work function of the second metal layer 19b>the work function of the second electrode layer 25 is adopted, the energy barrier OB is gradually reduced and the current can easily flow.

The second electrode layer 25 is a transparent electrode layer. The uneven shape 23 is provided at the interface between the second metal layer 19b and the second electrode layer 25. As described above, although the second electrode layer 25 formed of the ITO is formed thick in order to lower the resistance, the second electrode layer 25 is likely to be peeled off when the thickness of the ITO is set to be thick, which is significant particularly in the valleys of the wavy shape between the adjacent columnar portions 20. It is considered that film stress (contraction) during the formation of the ITO is applied in the valleys of the wavy shape in a state where the inclination of waves of the columnar portions 20 is large.

According to the configuration, by providing the uneven shape 23 and connecting the second metal layer 19b and the second electrode layer 25, connection resilience is improved since both the second metal layer 19b and the second electrode layer 25 at the interface are firmly bonded to each other due to unevenness, and the contact area is increased. Accordingly, the second electrode layer 25 is prevented from being peeled off. In particular, it is effective for a case where the uneven shape in the valleys of the wavy shape is large. As described above, since an uneven degree of the uneven shape 23 is formed to be larger in the valleys of the wavy shape than in the top portions, it is possible to withstand the increase in the film stress in the valleys, and the second metal layer 19b and the second electrode layer 25 are reliably joined. Further, as the contact area increases, the contact resistance decreases. Therefore, it is possible to reliably couple the thick second electrode layer 25 and the second metal layer 19b.

In the p-side electrode 8, the first metal layer 19a is a Ni layer, the second metal layer 19b is an Au layer, and the uneven shape 23 is formed on the surface of the Au layer by plasma processing.

Accordingly, the uneven shape 23 can be efficiently formed on the surface of the Au layer which is the interface between the first electrode layer 19 and the second electrode layer 25.

In addition, the uneven shape 23 is larger in the gap portion between the adjacent columnar portions 20 than in a portion that overlaps the columnar portions 20.

Accordingly, in the gap between the adjacent columnar portions 20, the large uneven shape 23 makes it possible to more closely adhere to the valley portion that is desired to be firmly coupled.

Second Embodiment

Outline of Projector

Figure 7:
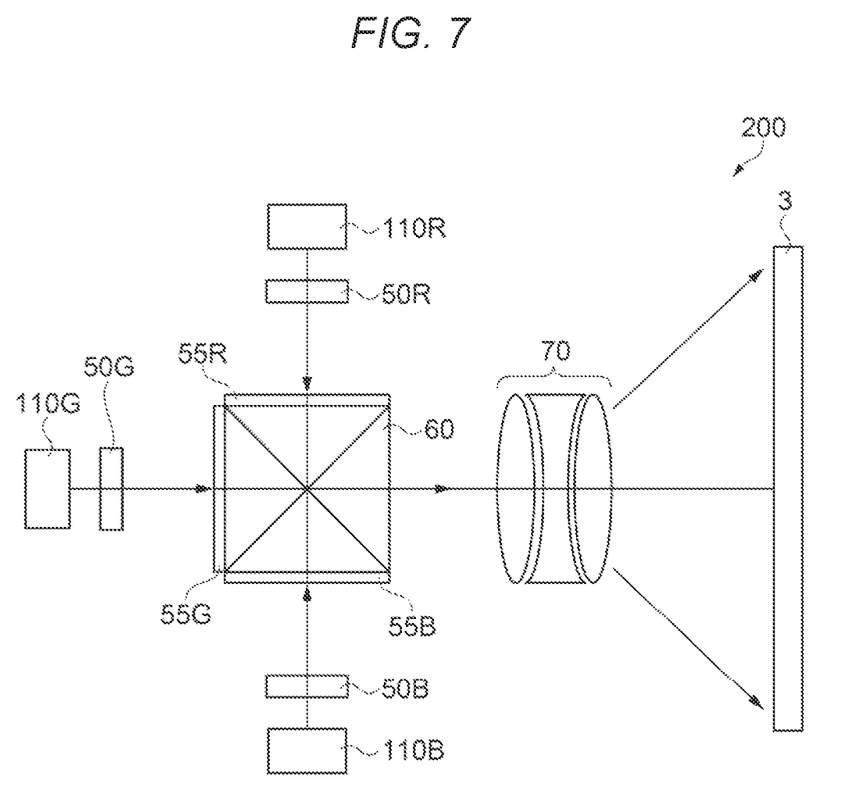
FIG. 7 is a schematic configuration diagram of a projector according to a second embodiment.

FIG. 7 is a schematic configuration diagram of a projector according to a second embodiment.

Here, a projector 200 according to the present embodiment will be described with reference to FIG. 7.

The projector 200 includes a housing (not shown), a red light source 110R, a green light source 110G, and a blue light source 110B, which are provided in the housing and emit red light, green light, and blue light, respectively.

Each of the red light source 110R, the green light source 110G, and the blue light source 110B includes the light emitting device 100 according to the first embodiment as a light source thereof.

The projector 200 further includes a first optical element 50R, a second optical element 50G, a third optical element 50B, a first light modulation device 55R, a second light modulation device 55G, a third light modulation device 55B, and a projection device 70, which are provided in the housing.

The first light modulation device 55R, the second light modulation device 55G, and the third light modulation device 55B are, for example, transmissive liquid crystal light valves. The projection device 70 is, for example, a projection lens.

The light emitted from the red light source 110R is incident on the first optical element 50R. The light emitted from the red light source 110R is focused by the first optical element 50R. The first optical element 50R may have a function other than light focusing. The same applies to the second optical element 50G and the third optical element 50B to be described below.

The light focused by the first optical element 50R is incident on the first light modulation device 55R. The first light modulation device 55R modulates the incident light in accordance with image information. Then, the projection device 70 enlarges an image formed by the first light modulation device 55R and projects the image onto a screen 3.

The light emitted from the green light source 110G is incident on the second optical element 50G. The light emitted from the green light source 110G is focused by the second optical element 50G.

The light focused by the second optical element 50G is incident on the second light modulation device 55G. The second light modulation device 55G modulates the incident light in accordance with the image information. Then, the projection device 70 enlarges an image formed by the second light modulation device 55G and projects the image onto the screen 3.

The light emitted from the blue light source 110B is incident on the third optical element 50B. The light emitted from the blue light source 110B is focused by the third optical element 50B. The light focused by the third optical element 50B is incident on the third light modulation device 55B. The third light modulation device 55B modulates the incident light in accordance with the image information. Then, the projection device 70 enlarges an image formed by the third light modulation device 55B and projects the enlarged image onto the screen 3.

The projector 200 includes a cross dichroic prism that combines the light emitted from the first light modulation device 55R, the second light modulation device 55G, and the third light modulation device 55B and guides the combined light to the projection device 70.

The light of three colors modulated by the first light modulation device 55R, the second light modulation device 55G, and the third light modulation device 55B are incident on the cross dichroic prism 60. The cross dichroic prism 60 is formed by bonding four right-angle prisms, and a dielectric multilayer film that reflects red light and a dielectric multilayer film that reflects blue light are arranged on an inner surface thereof. The light of three colors is combined by the dielectric multilayer films, and light representing a color image is formed. Then, the combined light is projected onto the screen 3 by the projection device 70, and the enlarged image is displayed.

The red light source 110R, the green light source 110G, and the blue light source 110B may directly form an image without using the first light modulation device 55R, the second light modulation device 55G, and the third light modulation device 55B by controlling the light emitting device 100 as a pixel of the image according to the image information. Further, the projection device 70 may enlarge the image formed by the red light source 110R, the green light source 110G, and the blue light source 110B and project the image onto the screen 3.

As described above, the projector 200 includes the light emitting device 100 that secures stable electrical connection. Therefore, it is possible to provide the projector 200 with high reliability.

Although a transmissive liquid crystal light valve is used as a light modulation device in the above example, a light valve other than the liquid crystal light valve may be used, or a reflective light valve may be used. Examples of such a light valve include a reflective liquid crystal light valve and a digital micro mirror device. A configuration of the projection device is appropriately changed depending on a type of the light valve to be used.

The light source can also be applied to a light source device of a scanning type image display device which includes a scanning unit which is an image forming device that displays an image of a desired size on a display surface by scanning a screen with light from the light source.

The light emitting device 100 according to the embodiment described above can be used in addition to the projector. Applications other than the projector include, for example, indoor lighting, a backlight of a display, a laser printer, a scanner, in-vehicle light, a sensing machine using light, and a light source of such as a communication device.

First Modification

In the first embodiment described above, the case where the light emitting device 100 is a semiconductor laser using the columnar portions 20 is described, and the light emitting device 100 may be a super luminescent diode using the columnar portions 20 or a light emitting diode using the columnar portions 20.

Second Modification

In the light emitting device 100 according to the first embodiment described above, the InGaN-based light emitting layer 16 is described, and various materials capable of emitting light by injecting a current can be used as the light emitting layer 16 in accordance with a wavelength of light to be emitted. For example, an AlGaN-based, AlGaAs-based, InGaAs-based, InGaAsP-based, InP-based, GaP-based, or AlGaP-based semiconductor materials can be used.

What is claimed is:

1. A light emitting device comprising:
   a substrate;
   a laminated structure that is provided on the substrate and that includes a plurality of columnar portions; and
   an electrode that is provided at an opposite side of the laminated structure from the substrate,
   wherein the columnar portion includes a first semiconductor layer, a second semiconductor layer of a conductivity type different from that of the first semiconductor layer, and a light emitting layer located between the first semiconductor layer and the second semiconductor layer, and
   the electrode is connected to the second semiconductor layers in the plurality of columnar portions, and includes:
      a first electrode layer formed of a material that has a work function smaller than that of the second semiconductor layer, and
      a second electrode layer that is connected to the first electrode layer and that has a work function smaller than that of the first electrode layer, and
   an interface between the first electrode layer and the second electrode layer has an uneven shape that includes a plurality of peaks and valleys, and the peaks have a height of 10 nm or less.

2. The light emitting device according to claim 1, wherein
   the first electrode layer is a metal layer, and includes a first metal layer and a second metal layer, and
   a work function of the first metal layer connected to the second semiconductor layer is larger than a work function of the second metal layer.

3. The light emitting device according to claim 1, wherein
   the second electrode layer is a transparent electrode layer, and
   the uneven shape is provided at an interface between a second metal layer and the second electrode layer.

4. The light emitting device according to claim 1, wherein
   in the electrode,
   a first metal layer is a Ni layer,
   a second metal layer is an Au layer, and
   the uneven shape is formed at a surface of the Au layer by plasma processing.

5. The light emitting device according to claim 1, wherein
   an uneven degree of the uneven shape is larger in a gap portion between the adjacent columnar portions than in a portion that overlaps the columnar portion.

6. A projector comprising:
   the light emitting device according to claim 1.

* * * * *